(12) United States Patent
Shimizu et al.

(10) Patent No.: US 6,324,068 B1
(45) Date of Patent: Nov. 27, 2001

(54) ELECTRONIC COMPONENT DEVICE, AND MAIN BOARD FOR CIRCUIT BOARDS

(75) Inventors: Kiyoshi Shimizu; Yoshihiro Ishida, both of Tanashi (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/569,310

(22) Filed: May 11, 2000

Related U.S. Application Data

(62) Division of application No. 09/216,932, filed on Dec. 21, 1998.

(30) Foreign Application Priority Data

Dec. 22, 1997 (JP) .................................................... 9-352867
Mar. 25, 1998 (JP) .................................................. 10-077159

(51) Int. Cl.$^7$ ...................................................... H05K 3/40
(52) U.S. Cl. ...................... 361/777; 361/760; 361/764; 174/255; 174/262; 228/180.22; 29/846; 29/832
(58) Field of Search ................................... 361/777, 760, 361/764, 778, 779; 174/255, 263, 250, 262; 427/96, 195, 198; 228/180.22; 29/846, 825, 890, 412–413, 415

(56) References Cited

U.S. PATENT DOCUMENTS

| | | | |
|---|---|---|---|
| 4,511,757 | * | 4/1985 | Ors et al. .............................. 174/68.5 |
| 5,072,075 | * | 12/1991 | Lee et al. ............................... 174/264 |
| 5,191,147 | * | 3/1993 | Chang et al. ......................... 174/266 |
| 5,368,884 | * | 11/1994 | Yamagami et al. .................... 427/96 |
| 5,490,324 | * | 2/1996 | Newman ................................ 29/830 |
| 5,557,844 | * | 9/1996 | Bhatt et al. ............................ 29/852 |
| 5,615,477 | * | 4/1997 | Sweitzer ................................ 29/840 |
| 5,631,186 | * | 5/1997 | Park et al. ............................ 438/155 |
| 5,744,758 | * | 4/1998 | Takenouchi et al. ................. 174/255 |
| 5,786,238 | * | 7/1998 | Pai et al. .............................. 438/118 |
| 5,841,901 | * | 11/1998 | Arai et al. ............................ 382/187 |

\* cited by examiner

Primary Examiner—Leo P. Picard
Assistant Examiner—David Foster
(74) Attorney, Agent, or Firm—Kanesaka & Takeuchi

(57) ABSTRACT

The contours of openings of a solder resist defining exposed portions of electrode pads and the contours of openings of the solder resist defining the contours of register or patterns are simultaneously formed by photolithography using the same mask pattern. As a result, the patterns for registration can be easily formed on a main board or circuit boards. Also, it is possible to increase the positional accuracy of the register or patterns relative to the positions of the electrode pads.

12 Claims, 18 Drawing Sheets

ELECTRONIC COMPONENT DEVICE, AND MAIN BOARD FOR CIRCUIT BOARDS

CROSS REFERENCE TO RELATED APPLICATION

This is a divisional application of Ser. No. 09/216,932 filed on Dec. 21, 1998.

TECHNICAL FIELD

The present invention relates to an electronic component device having a circuit board on which are mounted electronic components such as IC chips and on which are formed electrode patterns for external connections, and to a method for manufacturing the same as well as to a main board for circuit boards for use in manufacturing the electronic component device.

BACKGROUND ART

With reduced dimensions and increased density of flip chip semiconductor packages, a flip chip bonding has been developed which allows bare chips to be mounted directly on a substrate. Moreover, a hand-held equipment such as a camera-integrated VTR or a cellular phone has recently appeared one after another which is mounted with small-sized packages, so-called CSPs (chip size/scale packages) which have substantially the same dimensions as those of the bare chips. In such circumstances, a demand of market for the CSPs is significantly increased, inducing a recent rapid development of the CSPs.

A main board for circuit boards is used for the manufacture of the flip chip semiconductor packages in the form of the CSPs. The main board consists of a plurality of circuit boards which are integrally arranged and formed. Both side surfaces of each circuit board are formed with electrode pads (hereinafter referred to as bonding pads) for mounting IC chips thereon and with electrode pads for external connections which are electrically connected via through-holes to the bonding pads. After the mounting of the IC chips thereon, the main board is separated into the plurality of circuit boards.

Referring now to FIGS. 10(A)–10(F), description is made for a process for forming a conventional aggregated circuit board.

FIGS. 10(A)–10(F) are process diagrams for explaining the board formation process of the main board for circuit boards.

Prior to the formation of the main board, an insulating base material 101 is first prepared which is made of ceramics or resin and in which both side surfaces are clad with copper films 102 (FIG. 10(A)).

A through-hole 103 is then formed in this copper-clad base material 101 (FIG. 10(B)).

By means of electroless copper plating or electrolytic copper plating, a copper plating layer 104 is formed on the both side surfaces of the base material 101 having the through-hole 103 formed therein (FIG. 10(C)). The copper plating layer 104 is formed on the copper films 102 and on the side wall of the through-hole 103. This copper plating layer 104 allows the both side surfaces of the base material 101 to electrically conduct to each other.

A filler material 105 such as resin is then filled into the through-hole 103 (FIG. 10(D)).

The copper plating layer 104 is further laminated with plating resists which are in sequence exposed to light and developed to form a pattern mask (not shown). Afterward the copper plating layer 104 is subjected via this pattern mask to a pattern etching using an etching liquid or the like. As a result of this pattern etching, a plurality of electrodes (bonding patterns) 3 for IC connections are arranged on the top surface side of the main board 100, with the formation of electrodes 4 for external connections in the form of pad electrodes arranged on the bottom surface side in a matrix manner (FIG. 10(E)).

Solder resist processing is then carried out to form a solder resist film 106 on the bottom surface side of the main board 100 (FIG. 10(F)). This solder resist film 106 has openings which allow the electrodes 3 for IC connections and the electrodes 4 for external connections to be partially exposed. Portions of the electrodes 3 for IC connections and of the electrodes 4 exposed in the openings form respectively bonding pads 3a which are solderable regions and electrode pads 4a for external connections. By virtue of the formation of this solder resist film 106, the surface of the main board 100 becomes flattened. Furthermore, a gold plating (not shown) is usually provided on the surfaces of the bonding pad 3a and the electrode pad 4a.

Thus, there is finished the main board 100 having a multiplicity of solderable regions of the same geometry arranged on its surface in a matrix manner.

Referring is then made to FIGS. 11(A) to 12(B) to schematically describe a method for manufacturing a BGA (ball grid array) of a flip chip having solder ball electrodes formed on its circuit board, the method being an example of a conventional method for manufacturing a CSP flip chip semiconductor package.

In FIGS. 11(A) to 11(C) and in FIGS. 12(A) and 12(B), top plan views are on the right side of the diagrams and sectional views taken along respective cutting lines of the top plan views are on the left side of the top plan views.

It is to be noted that FIGS. 11(A) to 12(B) illustrate examples in which four circuit boards 1 are formed therefrom for convenience.

The conventional semiconductor package manufacturing process includes a main board formation process (FIG. 11(A)), an IC chip mounting process (FIG. 11(B)), a resin sealing process (FIG. 11(C)), a reference member attachment and electrode formation process (FIG. 12(A)) and a dicing process (FIG. 12(B)).

For the manufacture of the BGA, the main board 100 formed by the above main board formation process (FIG. 11(A)) is prepared.

Although in FIG. 11(A) the electrodes 3 for IC connections and the electrodes 4 for external connections are diagrammatically shown as raised portions, the electrodes 3 for IC connections and the electrodes 4 for external connections are actually in the form of recessed portions as set forth above.

Then, prior to the mounting of the IC chips, solder bumps 5 are formed on top of pad electrode faces of an IC wafer (not shown). Known as the method for forming these solder bumps 5 are, for example, a stud bump method, a ball bump method and a plating bump method, etc. Among these methods, the plating bump method is effective for the downsizing of the IC chips since it allows the bumps to be formed in narrow arrays between the pad electrodes.

The IC wafer having solder bumps formed thereon is then cut into predetermined chip sizes while being adhered to an adhesive tape, to form IC chips 6. In the cutting, use is a device such as a dicing saw to cut the IC wafer in X and Y directions in a full-cut mode. Afterward, the IC chips 6 on the adhesive tape are separated into unitary components.

Then, in the IC chip mounting process, as shown in FIG. 11(B), flip chips are mounted one by one on the associated circuit boards of the main board 100. For the flip chip mounting, flux (not shown) is first applied to any predetermined positions on the electrodes 3 for IC connections (see FIG. 11(A)) formed on the solder bumps 5 or on the top surface side of the main board 100. Afterward, the IC chips 6 are placed one by one for each circuit board 1 on the main board 100. For the placement, the surface side of the IC chips 6 having the solder bumps 5 formed thereon is made to confront the top surface side of the main board 100, with the solder bumps 5 being positioned on the electrodes 3 for IC connections. Subsequently, solder reflow is carried out to electrically connect the electrodes 3 for IC connections to these IC chips 6. Thus, the IC chips 6 are mounted on the main board 100.

Then, in the sealing process, use is a thermosetting sealing resin 7 to perform side potting over a plurality of adjacent IC chips 6, to thereby integrally resin seal the plurality of IC chips 6. By virtue of this, as shown in FIG. 11(C), the IC chips 6 are fixed on the individual circuit boards 1 of the main circuit board 100 with facedown in a sealed manner.

Then in the reference member attachment process, the top surfaces of the IC chips 6 mounted on the main board 100 are adhesively attached on the reference member 8 by means of fixing means such as an adhesive agent or an adhesive tape.

Then, in the electrode formation process, solder balls are first secured to the electrodes 4a for external connections formed on the bottom surface side of the individual circuit boards 1. Then, the solder balls are subjected to reflow to form solder ball electrodes 9 as shown in FIG. 12(A).

Then, in the dicing process, as shown in FIG. 12(B), the main board 100 is cut along cut lines 2 in the X and Y directions formed in the main board 100 by use of cutting means such as the dicing saw as shown in FIG. 12(B). Then, the circuit boards which are cut (the cut circuit boards) 1 are separated into individual circuit boards 1.

Afterward, the adhesive agent or the like is dissolved by a dissolving liquid or the like to release the circuit board 1 from the reference member 8.

Through the above processes the flip chip BGA (ball grid array) as an example of the flip chip semiconductor package is finished.

By the way, the positions of the cut lines 2 are determined with respect to register as a reference indicative of cutting positions, formed on the main board 100.

Herein, FIG. 13(A) is a bottom plan view of the main board 100 having register for cutting formed thereon. A plurality of rectangular register pairs 11 is formed in the peripheral regions other than the circuit boards 1 of the main board 100. The cut lines pass through the register pairs 11. In addition, two rectangular register pairs in cooperation determine the position of each cut line 2.

FIG. 13(B) is a sectional view of the register 11 taken along a line 13(B)—13(B) in FIG. 13(A). As shown FIG. 13(A), the register is formed as metal patterns made of, e.g., copper on the base material 101.

FIG. 13(C) is a sectional view of the electrode pads 4a taken along a line 13(C)—13(C) in FIG. 13(A). As shown in FIG. 13(C), the solder resist 106 covers the peripheral portions of the electrodes 4 for external connections formed on the base material 101. Therefore, exposed portions of the electrodes 4 for external connections form the electrode pads 4-a.

Japanese Patent Laid-open Pub. No. Hei8-153819 discloses another example of the high-density main board allowing a multiplicity of circuit boards to be acquired therefrom. FIG. 14 is a top plan view of the main board disclosed in this publication. As shown in FIG. 14, this main board 110 is of a strip-like shape and has working holes 12 formed at its four corners. FIG. 14 shows an example of the main board 110 for acquiring two circuit boards therefrom.

This main board 110 is formed as follows. That is, after the formation of through-holes in the main board 110, a copper plating layer is formed and patterned to form common electrodes 14 and circuit patterns electrically conducting to these common electrodes 14. Then, the both side surfaces of the main board 110 are laminated with dry films. At that time, there remain exposed the connecting portions of the IC chips, bonding wires and solder bumps, and the common electrodes 14 among the circuit patterns. Furthermore, a voltage is applied to the common electrodes 14 to form Ni—Au plating layer on the exposed connecting portions. Then, by means of a router machining, elongated apertures 16 are formed in each circuit board 1 along its four edges, leaving joining portions 15 at four corners of each circuit board 1. The main board 110 is thus formed.

Furthermore, the IC chips are mounted on the top surface of the main board 110 and solder ball electrodes (solder bumps) for external connections are formed on the bottom surface thereof, and after that, the joining portions 15a are severed along separation lines 15 by press cutting to obtain the BGA. Upon the press cutting, the circuit board 1 is not subjected to any excessive load due to the reduced width of the joining portions 15a, achieving an extremely easy cutting.

Referring then to FIGS. 15(A)–15(G), description is made for processes in which the IC chips are mounted on the main board 110 with the formation of the solder ball electrodes to manufacture the BGA. FIGS. 15(A)–15(G) are process diagrams in section for explaining a method for manufacture of the BGA.

First, FIG. 15(A) diagrammatically shows the main board 110 shown in FIG. 14.

In FIG. 15(A), there are invisible circuit patterns such as the common electrodes 14, the through-holes 103 and the elongated apertures 16 which are shown in FIG. 14. Instead, the outer periphery of the circuit board 1 is diagrammatically shown.

The IC chips 6 are then mounted one by one on the top surface of each circuit board 1 of the main board 110 by means of a free chip method or a wire bonding method (FIG. 15(B)).

The mounted IC chips 6 are then hermetically sealed with a resin (FIG. 15(C)).

Solder ball electrodes 9 are then formed for each circuit board 1 on the bottom surface of the main board 110 (FIGS. 15(D) and 15(E)).

Incidentally, FIG. 15(D) shows the bottom surface of the main board 110 and FIG. 15(E) is a sectional view of the main board 110 having the solder ball electrodes 9 formed thereon.

The semiconductor package is then separated into individual circuit boards 10 by press cutting to obtain the BGA (FIGS. 15(F) and 15(G)).

Incidentally, FIG. 15(F) is a bottom plan view of the BGA and FIG. 15(G) is a sectional view of the BGA.

Referring then to FIGS. 16(A)–16(C), description is made for a method for forming the solder ball electrodes 9. FIG.

16(A) is a bottom plan view of the main board 110. For the formation of the solder ball electrodes 9, flux 9a is applied to the electrode pads 4a for external connections by using the working holes 12 as reference, and after that, solder balls 9b are placed thereon (FIG. 16(B)). Reflow is then carried out to integrate the flux 9a with the solder balls 9b to thereby form solder ball electrodes 9 in the form of projecting electrodes (FIG. 16(C)).

It is to be noted in FIGS. 16(B) and 16(C) that the process for forming a solder ball electrode 9 in a single electrode pad 4a is typically shown.

The BGA as the semiconductor package is then mounted on a mother board. A block diagram of FIG. 17 illustrates a process for the mounting of the BGA onto the mother board. For the mounting onto the mother board, a mother board is first supplied (step B1).

A soldering paste is then printed on electrode portions of the mother board (step B2).

On the other hand, a semiconductor package (BGA) is manufactured in advance by the above processes (step B3).

Then, for the mounting of the BGA onto the mother board, the solder ball electrodes of the BGA are registered with the electrode portions of the mother board using the quadrangular external shape of the BGA as reference (step B4).

The BGA is then placed on the mother board (step B5).

Reflow is then carried out to connect the solder ball electrodes of the BGA to the electrode portions of the mother board (step B6).

The mother board and the BGA are finally cleaned to complete the mounting process onto the mother board (step B7).

A block diagram of FIG. 18 shows another process for mounting the BGA onto the mother board. For the mounting onto the mother board, a mother board is first supplied (step C1).

Soldering paste is then printed on electrode portions of the mother board (step C2). On the other hand, a semiconductor package (BGA) is manufactured in advance by the above processes (step C3).

Then, for the mounting of the BGA onto the mother board, the solder ball electrodes of the BGA are registered with the electrode portions of the mother board using the arrangement of the solder ball electrodes as reference instead of the external shape of the BGA (step C4). That is, by recognizing the arrangement pattern of the solder ball electrode on the bottom surface of the BGA, registration is effected between the solder ball electrodes and the electrode portions. In addition, the recognition of the arrangement pattern enables the directionality of the BGA relative to the mother board to be verified.

The BGA is then placed on the mother board (step C5).

Furthermore, reflow is carried out to connect the solder ball electrodes of the BGA to the electrode portions of the mother board (step C6 of FIG. 18).

The mother board and the BGA are finally cleaned to complete the mounting of the BGA onto the mother board.

By the way, the positions of the register for cutting shown in FIGS. 13(A)–13(C) are usually determined by a process which is different from the process for defining the contour of the electrode pads for external connections. That is, in the example of FIG. 13(B), the contour of the register 11 for cutting is determined by the contour of the copper patterns. On the contrary, in the example of FIG. 13(C), the contour of the electrode pads 4a is determined by the contour of the openings of the solder resist 106 since the peripheral portions of the electrodes 4 for external connections are covered by the solder resist 106. As a result of this, a problem has arisen that positional accuracy of the register relative to the positions of the electrode pads 4a is poor. For this reason, there has sometimes been seen a lowering in accuracy, relative to the positions of the electrode pads 4a, of the positions of the cut lines 2 determined by the positions of the register 11 shown in FIG. 13(A).

Furthermore, occurrence of errors in the positions of the cut lines 2 may result in occurrence of an error in the position of external shape of the BGA relative to the positions of the electrode pads 4a. As a result of this, if the BGA is mounted on the mother board with the external shape of the BGA as reference, the positions of the solder ball electrodes formed on the electrode pads 4a of the BGA may be offset relative to the positions of the electrode portions of the mother board. Then, in some instances, a defective contact may occur between the solder ball electrodes and the electrode portions of the mother board.

Furthermore, in the case of the main board 110 shown in FIGS. 16(A)–16(C), the positions of the electrode pads 4a for external connections are determined by using the working holes 12 as reference. However, the opening accuracy of the working holes 12 is constant, making it difficult to secure a positional accuracy exceeding a certain level of the electrode pads 4a relative to the positions of the working holes 12. As a result of this, there arose a problem that in case a higher positional accuracy is demanded due to narrower pitches of the electrode pads, the positional accuracy using the working holes 12 as reference may become insufficient.

Furthermore, the working holes 12 are used also as reference for determining the positions of the elongated apertures 16 of the main board 110 shown in FIG. 14. For this reason, the position of the external shape of the circuit board 1 determined by a part of the contour of the elongated aperture 16 is also determined by using the working holes 12 as reference. However, the positional accuracy of the external shape of the circuit board 1 may not sufficiently be high in the case of using the working holes 12 as reference. In addition, the positional accuracy of the electrode pads 4a relative to the external shape whose positions are both determined by using the working holes 12 as reference is not sufficiently high either. For this reason, as shown in FIG. 17, if the BGA is mounted on the mother board using the external shape of the circuit board 1 as reference, the positions of the solder ball electrodes formed on the electrode pads 4a of the BGA may be offset relative to the positions of the electrode portions of the mother board. Then, in some instances, a defective contact may occur between the solder ball electrodes and the electrode portions of the mother board.

In addition, upon mounting of the BGA onto the mother board, it was sometimes difficult to judge the direction of the BGA using the external shape as reference since the external shape of the circuit board is usually rectangular. For this reason, the circuit board may possibly be unaware that the mounting direction is wrong even though the BGA has turned through 90 degrees or 180 degrees relative to the correct mounting direction.

Furthermore, when mounting the BGA onto the mother board through the recognition of the arrangement pattern of the solder ball electrodes, the overall surface on the bottom side of the circuit board is recognized. For this reason, there arose a problem that a larger recognition area requires a more recognition time, resulting in a longer cycle time and hence in a lower productivity. A further problem lays in that a necessity for the pattern recognition of a wider area upon mounting may bring about a rise of price of the mounting device.

In addition, it was sometimes difficult upon mounting of the BGA onto the mother board to judge the direction of the BGA in spite of the recognition of the arrangement pattern if the arrangement pattern of the solder ball electrodes is symmetrical with respect to a line or a point. For this reason, the circuit board may possibly be unaware that the mounting direction is wrong even though the BGA has turned through 90 degrees or 180 degrees relative to the correct mounting direction.

Therefore, in view of the above problems, the object of the present invention is to provide an electronic component device having register or patterns for registration formed with a high positional accuracy relative to the positions of electrode pads for external connections, a method for manufacturing the same, and a main board.

DISCLOSURE OF THE INVENTION

According to a method for manufacturing an electronic component device of the present invention, in which the electronic component device has a circuit board cut and separated from a main board, the circuit board being mounted with electronic components, the circuit board being formed with electrode pads for external connections on its first main surface side, the method comprises the step of, on the first main surface side, simultaneously with defining the contours of exposed portions of the electrode pads, defining the contours of register or patterns for registration made of the same material as that of constituent portions which define the contours of the exposed portions of the electrode pads.

In this manner, according to the method for manufacturing the electronic component device of this invention, on the main surface bearing electrode pads, the patterns are formed from the same material as that of constituent portions defining the contours of the exposed portions of the electrode pads, simultaneously with the definition of the contours of exposed portions. For this reason, it is possible to enhance the accuracy of the positions of register or patterns relative to the positions of the electrode pads.

Furthermore, in the method for manufacturing the electronic component device of the present invention, when the contours of the exposed portions are defined by the contours of the electrode pads themselves, the contours of the register or patterns made of the same material as that of the electrode pads are preferably defined simultaneously with the definition of the contours of the electrode pads.

By forming the register patterns from the same material simultaneously with the formation of the electrode pads in this manner, it is possible to form the register or patterns with a higher positional accuracy relative to the electrode pads when the exposed contours are contours of the electrode pads themselves.

Furthermore, in the method for manufacturing the electronic component device of the present invention, when the contours of the exposed portions are defined by the contours of openings of a solder resist covering the peripheral portions of the electrode pads, the contours of the register or patterns made of the solder resist are preferably defined simultaneously with the formation of the openings.

By forming the register or patterns from the same material simultaneously with the formation of the openings of the solder resist in this manner, it is possible to form the register or patterns with a higher positional accuracy relative to the electrode pads when the exposed contours are contours of the openings.

Furthermore, in the method for manufacturing the electronic device of the present invention, the register is preferably formed as patterns for indicating the positions of cutting of the main board for circuit boards.

By forming the register of this invention as the patterns for cutting in this manner, it is possible to enhance the positional accuracy of the cut lines relative to the positions of the electrode pads. This allows the positional accuracy, relative to the positions of the electrode pads, of the external shape of the circuit board as a result of the cutting along these cut lines, to be increased. In consequence, the semiconductor package can be mounted on the mother board with a higher positional accuracy by using this external shape as reference.

Furthermore, in the method for manufacturing the electronic component device of the present invention, the register is preferably formed as patterns for determining the positions of protrusive electrodes on the electrode pads.

By forming the register of this invention as the patterns for determining the positions in forming the protrusive electrodes in this manner, it is possible to form the protrusive electrodes with a higher positional accuracy on the electrode pads.

Furthermore, in the method for manufacturing the electronic component device of this invention, the register is preferably formed as recognition patterns for determining the positions of mounting of the electronic component device onto a mother board.

By forming the register of this invention as the patterns for determining the positions of mounting onto the mother board, it is possible to determine the positions of mounting through the recognition of only the arrangement pattern of the register. As a result of this, the time required for the pattern recognition can be reduced due to a narrow pattern recognition range as compared with the case where recognition is made by the arrangement pattern of the protrusive electrodes over the entire bottom surface of the electronic component device. Thus, the cycle time can be shortened, contributing to an improvement in the productivity.

Furthermore, in the method for manufacturing the electronic component device, the register or patterns is preferably formed on the circuit board at two points.

By forming the register or patterns at two points in this manner, it is possible to easily verify the direction of the electronic component device upon the mounting of the electronic component device onto the mother board. As a result of this, it is possible to obviate the mounting of the electronic component device onto the mother board with wrong mounting direction, to thereby improve the mounting properties.

Furthermore, for the execution of the present invention, the register or patterns preferably has different contours from each other.

By forming the register or patterns having different contours in this manner, it is possible to easily verify the direction of the electronic component device even when the register or patterns has been formed at symmetrical positions on the bottom surface of the electronic component device.

Furthermore, according to an electronic component device of the present invention, in which it has a circuit board which is mounted with electronic components and is formed with electrode pads for external connections on its first main surface side, the circuit board is provided with register or patterns on the first main surface side, the register or patterns being made of the same material as that of constituent portions defining the contours of exposed portions of the electrode pads, the contours of the register or patterns being defined simultaneously with the definition of the contours of the exposed portions.

According to the electronic component device of the present invention in this manner, on the main surface bearing the electrode pads there is provided register or patterns which has been formed from the same material as that of constituent portions defining the contours of the exposed portions of the electrode pads and which has been formed simultaneously with the definition of the contours of the exposed portions. For this reason, it is possible to enhance the positional accuracy of the register or patterns relative to the positions of the electrode pads.

Furthermore, in the electronic component device of this invention, when the contours of the exposed portions are defined by the contours of the electrode pads themselves, the register or patterns is preferably defined on the same material as that of the electrode pads simultaneously with the formation of the electrode pads.

As long as the register or patterns is formed on the same material as that of the electrode pads and simultaneously with the formation of the electrode pads in this manner, it is possible to enhance the positional accuracy of the register or patterns relative to the electrode pads when the exposed contours are contours of the electrode pads themselves.

Furthermore, in the electronic component device of this invention, when the contours of the exposed portions are defined by the contours of openings of a solder resist covering the peripheral portions of the electrode pads, the register or patterns is preferably defined by the solder resist simultaneously with the formation of the openings.

As long as the register or patterns is formed by the same material as that of the solder resist and simultaneously with the formation of the solder resist in this manner, it is possible to enhance the positional accuracy of the register or patterns relative to the electrode pads when the exposed contours are contours of the openings.

Furthermore, in the electronic component device of the present invention, the register is preferably patterns for determining the positions in forming protrusive electrodes on the electrode pads.

As long as the register of this invention is patterns for determining the positions in forming the protrusive electrodes in this manner, it is possible to form the protrusive electrodes with a high positional accuracy on the electrode pads.

Furthermore, in the electronic component device of this invention, the register is preferably recognition patterns for determining the position of mounting of the electronic component device on a mother board.

As long as the register of this invention is patterns for determining the positions of mounting onto the mother board in this manner, it is possible to determine the positions of mounting through the recognition of only the arrangement pattern of the register. As a result of this, the time taken for the pattern recognition can be reduced due to its narrower pattern recognition range as compared with the case of recognition of the arrangement patterns of the protrusive electrodes over the entire bottom surface of the electronic component device.

Furthermore, for the execution of this invention, the register or patterns is preferably provided at two points.

By providing the register or patterns at two points in this manner, it is possible to easily verify the direction of the electronic component device upon mounting of the electronic component device onto the mother board. As a result of this, it can be prevented that the electronic component device is mounted on the mother board with the wrong mounting direction.

Furthermore, for the execution of this invention, the register or patterns preferably has different contours from each other.

By forming the register or patterns to have different contours from each other in this manner, it is possible to easily verify the direction of the electronic component device even when the register or patterns has been formed at symmetrical positions on the bottom surface of the electronic component device.

Furthermore, for the execution of this invention, when the electrode pads are arranged at intersections of grids having certain intervals, the register or patterns is preferably disposed at positions which have been offset by half grid relative to the positions of the grids.

Through-holes are ordinarily formed at positions which have been offset by half grid relative to the grids of the electrode pads. Accordingly, by forming the register or patterns on the through-holes, it is possible to form the register or patterns without putting limitations on the positions in forming the electrode pads. Furthermore, each electrode pad is provided with a single through-hole so that a plurality of positions in forming the register or patterns can easily be secured.

Furthermore, according to the main board of the present invention, from which are formed a plurality of circuit boards each being formed with electrode pads for external connections on its first main surface side, the main board is provided with register or patterns on the first main surface side, the register or patterns being made of the same material as that of constituent portions defining the contours of exposed portions of the electrode pads, the contours of the register or patterns being defined simultaneously with the definition of the contours of the exposed portions.

In this manner, the main board of the present invention allows the register or patterns to be formed by the same material as that of constituent portions defining the contours of the exposed portions of the electrode pads and simultaneously with the definition of the contours of the exposed portions, on the first main surface having the electrode pads formed thereon. This enables the positional accuracy of the register or patterns relative to the positions of the electrode pads to be enhanced.

Furthermore, in the main board of this invention, at portions excluding the circuit boards, the register is preferably provided as patterns for indicating the positions of cutting of the main board.

As long as the register or patterns of this invention is register or patterns for cutting in this manner, it is possible to enhance the positional accuracy of the cut lines relative to the positions of the electrode pads. For this reason, there can be achieved a higher positional accuracy, relative to the positions of the electrode pads, of the external shape of the circuit boards as a result of cutting along the cut lines. This ensures mounting of the semiconductor package onto the mother board with a higher positional accuracy by using this external shape as reference.

Furthermore, in the main board of this invention, the register is preferably provided as patterns for determining the positions in forming protrusive electrodes on the electrode pads.

As long as the register of this invention is patterns for determining the positions in forming the protrusive electrodes in this manner, it is possible to form the protrusive electrodes with a higher positional accuracy on the electrode pads.

Furthermore, in the main board of this invention, the register is preferably provided as recognition patterns for determining the positions of mounting, onto a mother board, of an electronic component device which has been manufactured by use of the main board.

As long as the register of this invention is patterns for determining the positions in mounting onto the mother board in this manner, the mounting position can be determined through the recognition of only the arrangement patterns of the register. As a result of this, the time taken for the pattern recognition can be reduced due to its narrower pattern recognition region as compared with the case of recognition of the arrangement pattern of the protrusive electrodes over the entire bottom surface of the electronic component device.

BEST MODE FOR CARRYING OUT THE INVENTION

Embodiments of the present invention will now be described with reference to the drawings. It is to be noted that the drawings referred thereto merely schematically illustrate the sizes, shapes and arrangement relationships of the constituent elements for understanding this invention. Therefore, this invention is not limited to the shown examples.

First Embodiment

In a first embodiment, description is made for a main board provided with register or patterns for cutting, and an example of a method for manufacturing an electronic component device using the main board.

Figure 1A:
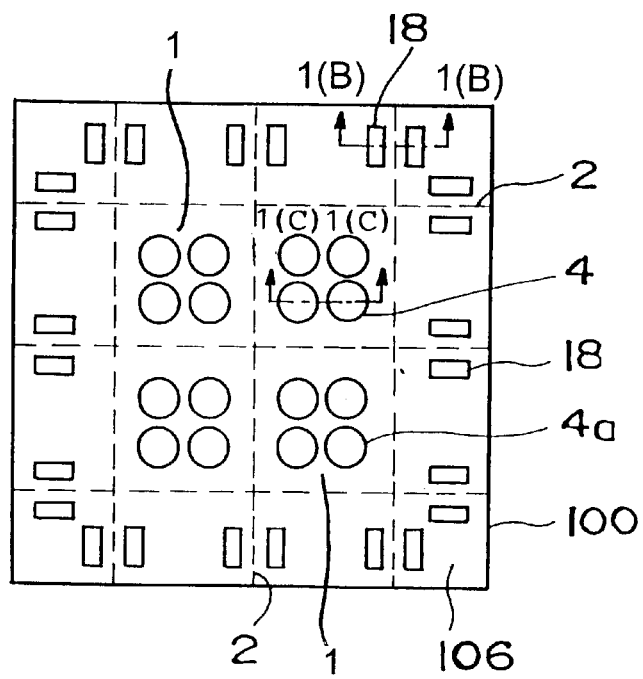
FIGS. 1(A)–1(C) relates to a first embodiment of the present invention, with FIG. 1(A) being a top plan view of a main board for circuit boards, FIG. 1(B) being a sectional view of register or patterns taken along line 1(B)—1(B) of FIG. 1(A), and FIG. 1(C) being a sectional view of electrode pads taken along a line 1(C)—1(C) FIG. 1(A)

First, FIG. 1(A) is a top plan view of a main board 100 on which register or patterns 18 for cutting is formed. The register or patterns 18 is formed in peripheral regions except circuit boards 1 on a first main surface side of the main board 100. In this case, a plurality of rectangular pattern pairs 18 is provided. A cut line 2 extends between the pattern pairs 18. Furthermore, two rectangular pattern pairs determine the position of each cut line 2 in cooperation.

Figure 1B:
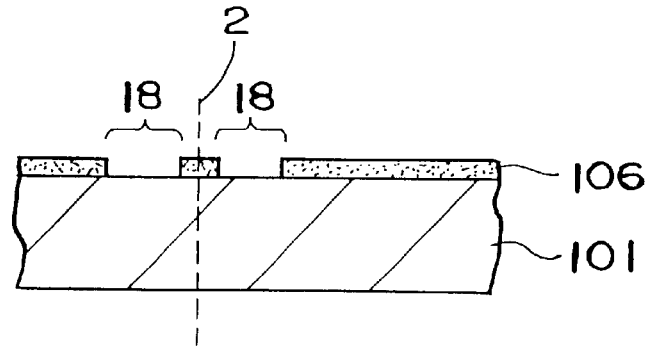
Figure 1C:
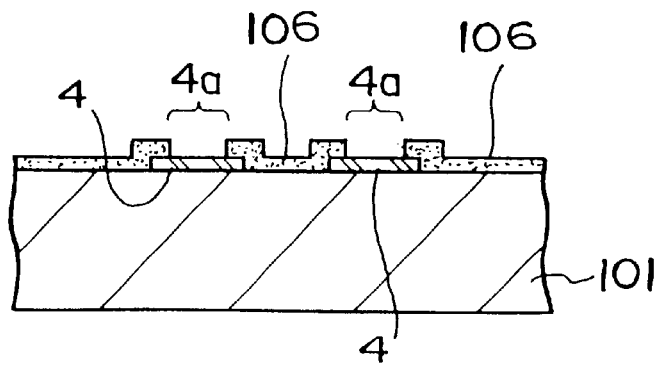

It is to be noted that in FIGS. 1(A)–1(C), the same constituent elements as those in the above conventional examples are designated by the same reference numerals.

FIG. 1(B) is a sectional view of the register or patterns 18 taken along line 1(B)—1(B) of FIG. 1(A). As shown in FIG. 1(B), the contours of the register or patterns 18 is defined by the contours of openings in the solder resist.

FIG. 1(C) is a sectional view of electrode pads 4a taken along line 1(C)—1(C) of FIG. 1(A). As shown in FIG. 1(C), the circular contours of these electrode pads 4a are defined by the contours of the openings in the solder resist 106 covering the peripheral portions of electrodes 4 for external connections. That is, in this case, the diameters of the openings in the solder resist 106 are smaller than the diameters of the electrodes 4 for external connections.

Figure 2A:
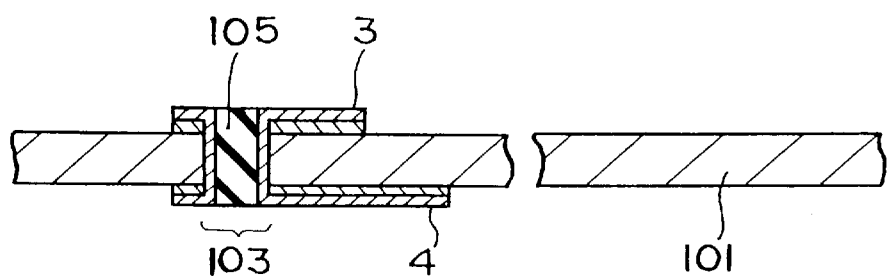
FIGS. 2(A) and 2(B) relate to the first embodiment and are sectional process diagrams of major parts for explaining a method for manufacturing a flip chip semiconductor package, in particular, a method for the manufacture of a main board.
Figure 2B:
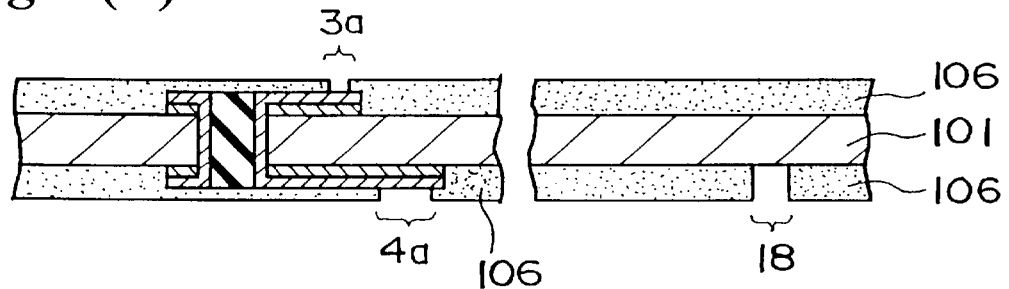
Figure 10A:
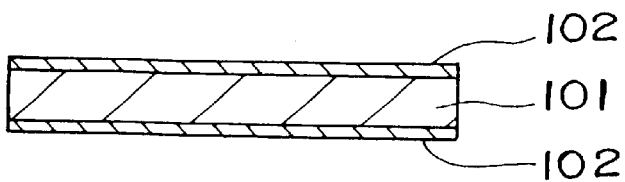
FIGS. 10(A)–10(F) are diagrams showing a conventional main board formation process.
Figure 10B:
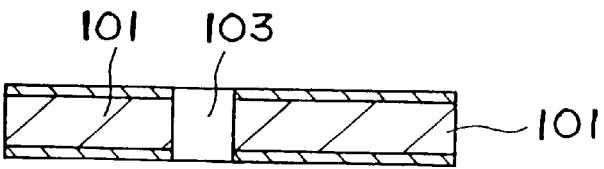
Figure 10C:
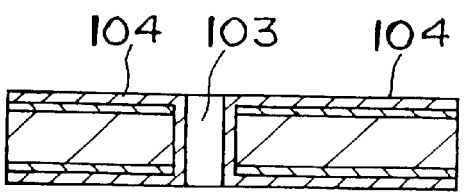
Figure 10D:
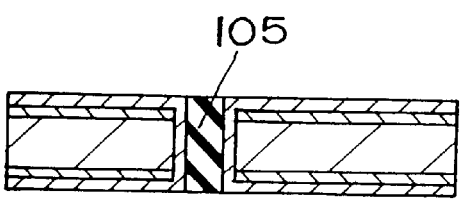
Figure 10E:
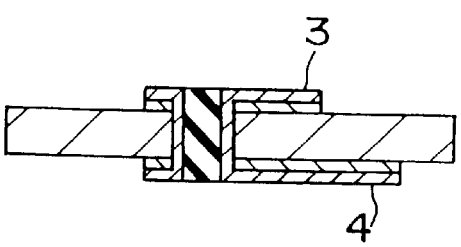
Figure 10F:
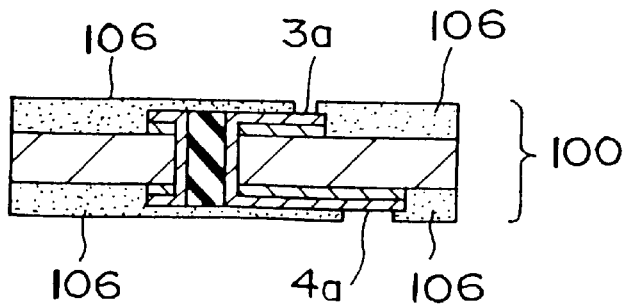
Figure 11A:
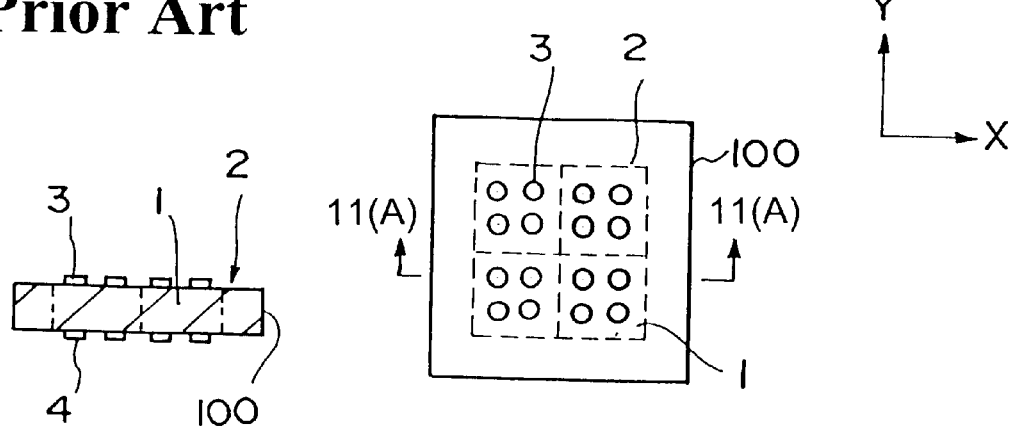
FIGS. 11(A)–11(C) are process diagrams for explaining a conventional method for manufacturing a flip chip semiconductor package, with FIG. 11(A) being an explanatory diagram of a main board formation process, FIG. 11(B) being an explanatory diagram of an IC mounting process, and FIG. 11(C) being an explanatory diagram of a resin sealing process, in which the right side of the drawing are plan views and the left side of the associated top plan views are sectional views thereof, and in FIGS. 11(B) and 11(C), electrodes 3 for IC connections and electrodes 4 for external connections are not visible.
Figure 11B:
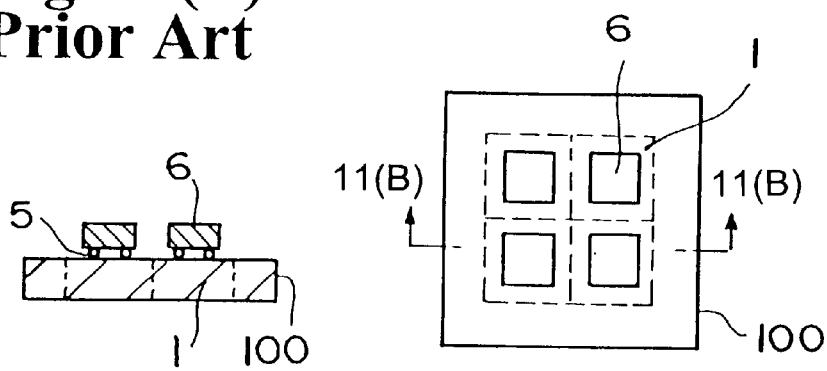
Figure 11C:
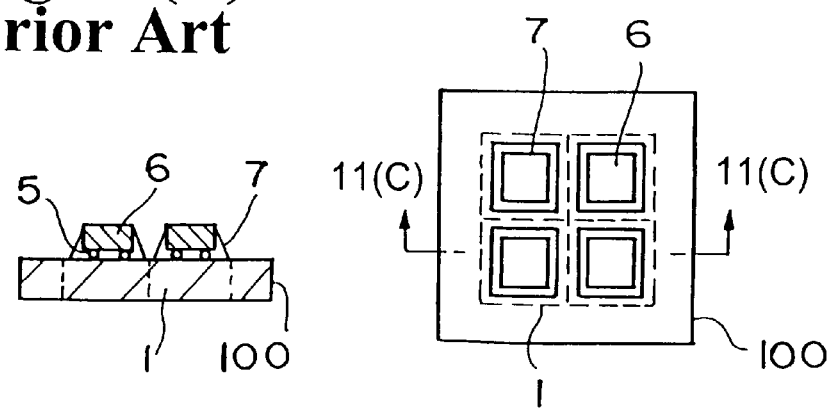
Figure 12A:
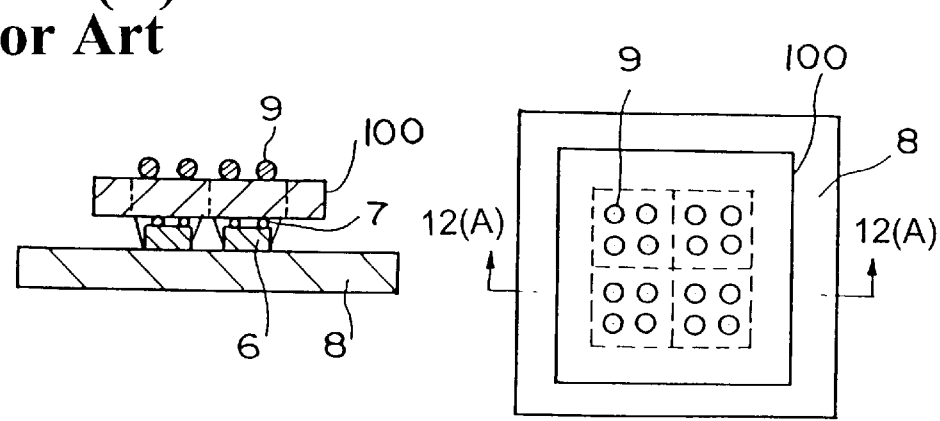
FIGS. 12(A) and 12(B) are process diagrams following FIG. 11(C), with FIG. 12(A) being an explanatory diagram of an attachment process and an electrode formation process, and FIG. 12(B) being an explanatory diagram of a cutting process, in which the right side of the drawing are top plan views and the left side of the associated top plan views are sectional views thereof, and in FIGS. 12(A) and 12(B), electrodes 3 for IC connections and the electrodes 4 for external connections are not visible.
Figure 12B:
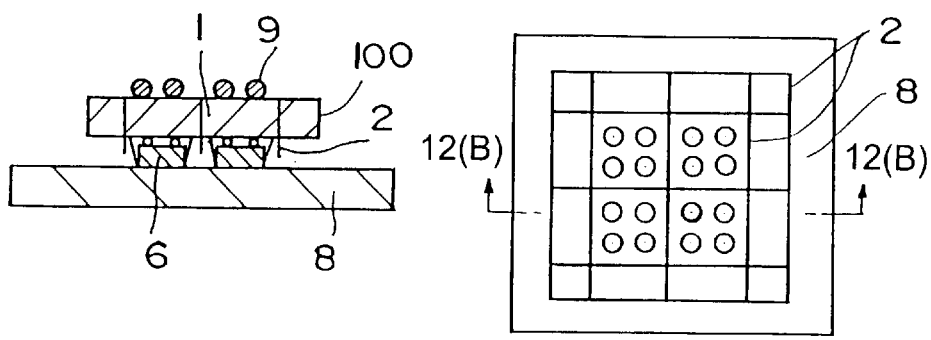
Figure 13A:
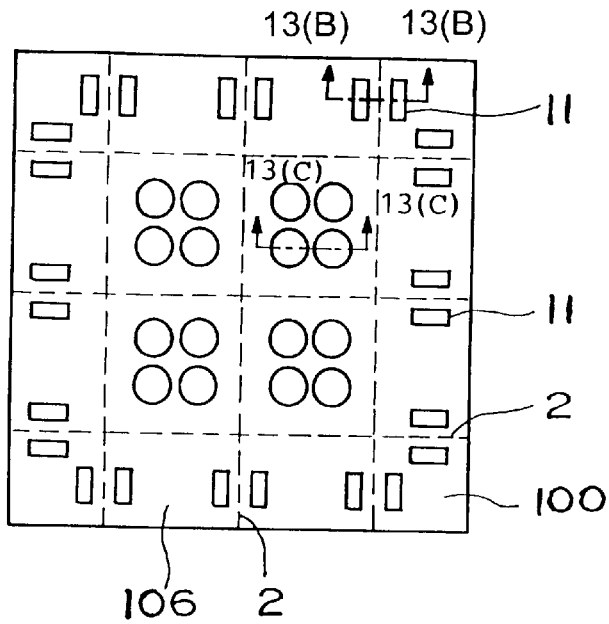
FIGS. 13(A)–13(C) relate to a conventional example, with FIG. 13(A) being a top plan view of a conventional circuit board, FIG. 13(B) being a sectional view of the register or patterns taken along line 13(B)—13(B) of FIG. 13(A), and FIG. 13(C) being a sectional view of the electrode pads taken along line 13(C)—13(C) of FIG. 13(A)
Figure 13B:
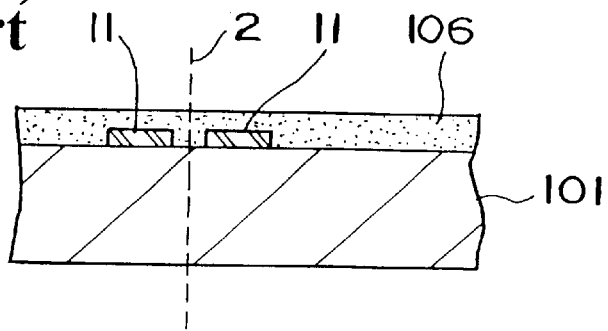
Figure 13C:
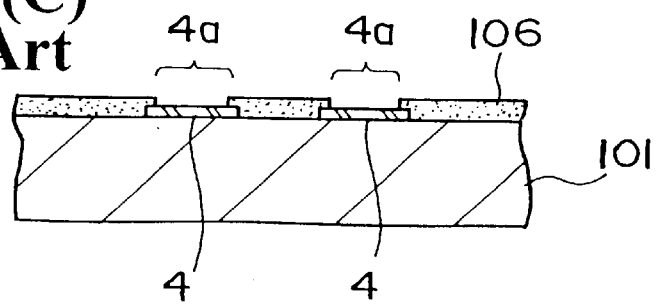

Referring then to FIGS. 1(A) and 2(B), description is made for a method for forming these register or patterns 18. FIG. 2(A) is a process diagram in section following FIG. 10(D), and FIG. 2(B) is a process diagram in section following FIG. 2(A).

Then, as shown in FIG. 2(A), in this embodiment, a copper plating layer or the like except patterns of the electrodes 4 for external connections is removed on the bottom surface side of a base material 101. Then, as shown in FIG. 2(B), when the solder resist 106 is patterned to define the contours of the electrode pads 4a, the contours of the patterns 18 are also defined as the openings at the same time. That is, the contours of the openings defining the exposed portions of the electrode pads 4a and the contours of the openings defining the contours of the patterns 18 are formed by photolithography using the same mask pattern.

By forming the patterns 18 in this manner, it is possible to enhance the positional accuracy of the patterns 18 relative to the positions of the electrode pads 4a. As a result of this, the positional accuracy of the cut lines 2 relative to the positions of the electrode pads 4a can be enhanced. It is thus possible to enhance the positional accuracy, relative to the positions of the electrode pads 4a, of the external shape of the circuit boards 1 as a result of cutting along the cut lines 2. In consequence, a semiconductor package can be mounted on a mother board with a high positional accuracy by using this external shape as reference.

Figure 3A:
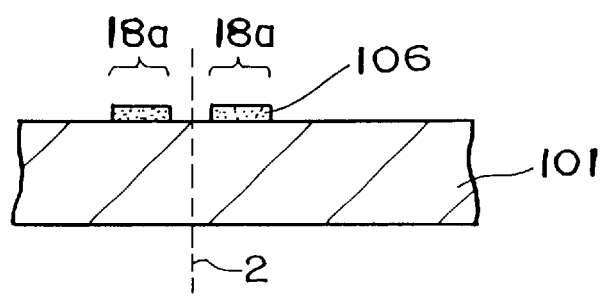
FIGS. 3(A)–3(C) relate to the first embodiment, with FIG. 3(A) being a sectional view of a major part for explaining the structure of the register or patterns, and FIGS. 3(B) and 3(C) being sectional process diagrams of major parts for explaining a method for manufacturing a flip chip semiconductor package, in particular, a method for the manufacture of a main board.

The register or patterns may be formed not only in the form of openings but also in the form of solder resist patterns 18a which are shaped like islands as shown in FIG. 3(A) for example. FIG. 3(A) is a sectional view of modified patterns 18a, which corresponds to the sectional view of the patterns 18a taken along a line 1(B)—1(B) of FIG. 1(A).

Figure 3B:
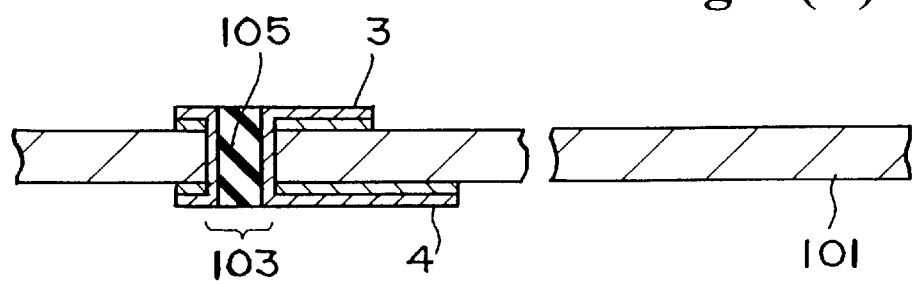
Figure 3C:
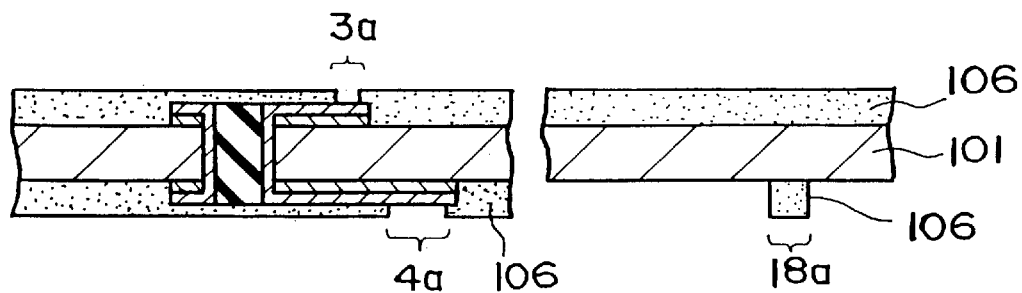

Referring then to FIGS. 3(B) and 3(C), description is made for a method for forming the register or patterns 18a. FIG. 3(B) is a process diagram in section which follows FIG. 10(D), and FIG. 3(C) is a process diagram in section which follows FIG. 3(B).

Then, as shown in FIG. 3(B), a copper plating layer or the like except the patterns of the electrodes 4 for external connections is removed on the bottom surface side of the base material 101. Then, as shown in FIG. 3(C), when the solder resist 106 is patterned to define the contours of the electrode pads 4a, the contours of the patterns 18a are defined as the contours of island-like patterns at the same time. That is, the contours of the openings defining the exposed portions of the electrode pads 4a and the contours of the island-shaped patterns 18a are formed by lithography using the same mask pattern.

In cases where the contours of the register or patterns are defined as the openings, copper patterns may be exposed in the bottom surfaces of the openings.

Figure 4A:
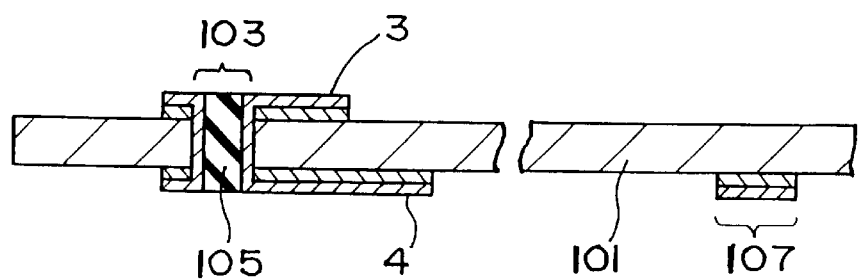
FIGS. 4(A) and 4(B) relate to the first embodiment and are sectional process diagrams of major parts for explaining a method for manufacturing a flip chip semiconductor package, in particular, a method for the manufacture of a main board.
Figure 4B:
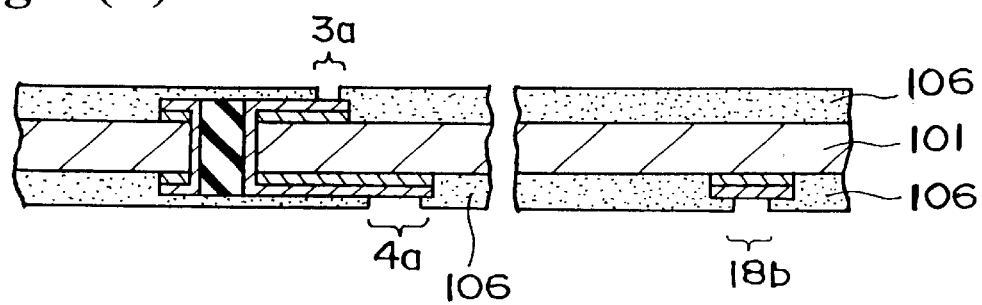

Then, referring to FIGS. 4(A) and 4(B), description is made for a method for forming register or patterns 18b disposed on such copper patterns 107. FIG. 4(A) is a process diagram in section which follows FIG. 10(D), and FIG. 4(B) is a process diagram in section which follows FIG. 4(A).

Then, as shown in FIG. 4(A), when the electrodes 4 for external connections are patterned, copper patterns 107 made of a copper plating layer are simultaneously defined in the region where the register or patterns are formed on the bottom surface side of the base material 101. Then, as shown in FIG. 3(C), when the solder resist 106 is patterned to define the contours of the electrode pads 4a, the contours of the patterns 18b are simultaneously defined as openings in the solder resist 106. That is, the contours of the openings defining the exposed portions of the electrode pads 4a and the contours of the openings defining the contours of the patterns 18b on the copper patterns are formed by lithography using the same mask pattern.

If the copper patterns are exposed in the bottom surfaces of the openings, the contours of the patterns become distinct due to distinct contrast between the copper patterns and the solder resists, thereby making the registration easier.

Second Embodiment

Next, in a second embodiment, description is made for a main board provided with register or patterns for cutting, and another example of a method for manufacturing an electronic component device using the main board.

Figure 5A:
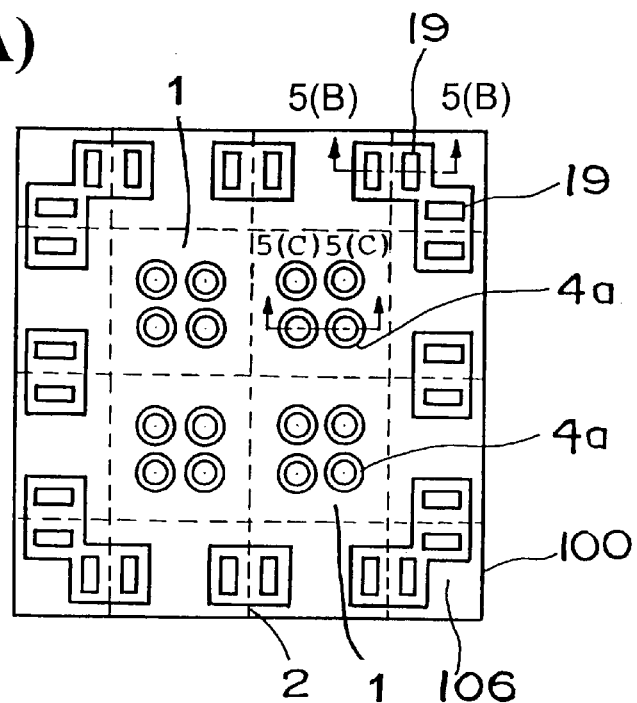
FIGS. 5(A)–5(C) relate to a second embodiment of the present invention, with FIG. 5(A) being a top plan view of a main board, FIG. 5(B) being a sectional view of register or patterns taken along line 5(B)—5(B) of FIG. 5(A), and FIG. 5(C) being a sectional view of electrode pads taken along line 5(C)—5(C) of FIG. 5(A)

First, FIG. 5(A) is a top plan view of a main board 100 on which register or patterns 19 for cutting is formed. These patterns 19 are arranged in peripheral regions except circuit boards 1 on a first main surface side of the main board 100, in the same manner as the register or patterns 18 of the first embodiment.

Figure 5B:
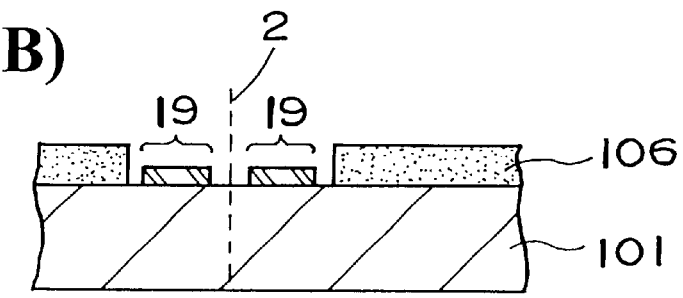

FIG. 5(B) is a sectional view of the or register patterns 19 taken along line 5(B)—5(B) of FIG. 5(A). As shown in FIG. 5(B), the contours of the patterns 19 are defined by the contours of the copper patterns. These copper patterns are made of the same material as that of the electrodes 4 for external connections.

Figure 5C:
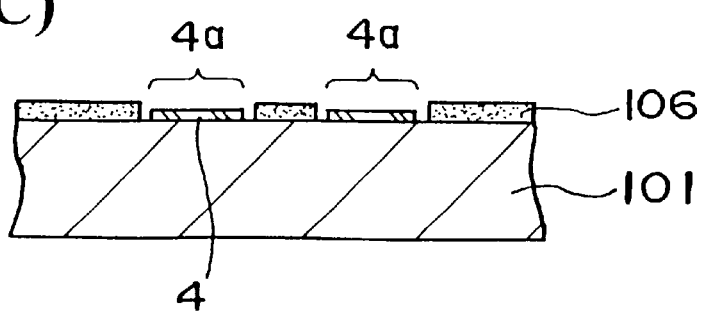

FIG. 5(C) is a sectional view of electrode pads 4a taken along line 5(C)—5(C) of FIG. 5(A). As shown in FIG. 5(C), the contours of these electrode pads 4a are defined by the contours of the electrodes 4 for external connections. That is, in this case, the diameters of the openings in the solder resist 106 are larger than those of the electrodes 4 for external connections.

Also, the contours of the electrode pads 4a and the contours of the patterns 19 are formed by photolithography using the same mask pattern.

By forming the patterns 19 from the same material simultaneously in this manner, it is possible to enhance the positional accuracy of the patterns 19 relative to the positions of the electrode pads 4a. As a result of this, the positional accuracy of the cut lines 2 relative to the positions of the electrode pads 4a can be enhanced. It is thus possible to enhance the positional accuracy, relative to the positions of the electrode pads 4a, of the external shape of the circuit boards 1 as a result of cutting along the cut lines 2. In consequence, a semiconductor package can be mounted on a mother board with a high positional accuracy by using this external shape as reference.

Third Embodiment

Next, in a third embodiment, description is made for a main board provided with register or patterns for mounting, an electronic component device using the main board, and an example of a method for manufacturing the same.

Figure 6A:
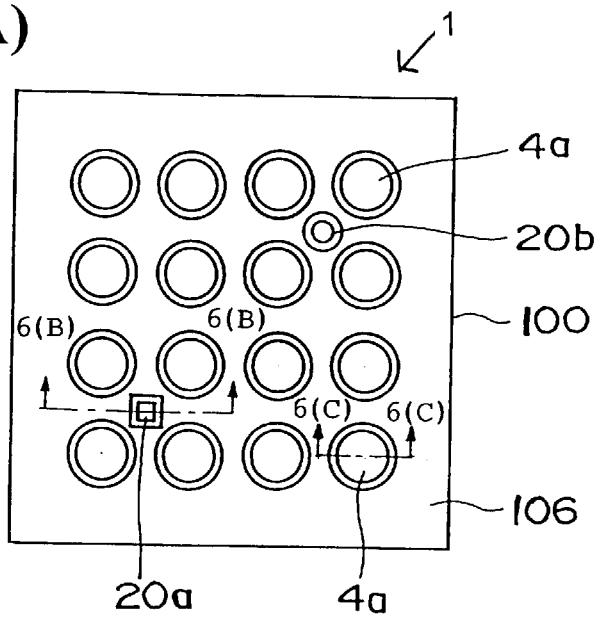
FIGS. 6(A)–6(D) relate to a third embodiment of the present invention, with FIG. 6(A) being a top plan view of a circuit board, FIG. 6(B) being a sectional view of register or patterns taken along line 6(B)—6(B) of FIG. 6(A), FIG. 6(C) being a sectional view of electrode pads taken along line 6(C)—6(C) of FIG. 6(A), and FIG. 6(D) being a sectional view of the state where solder ball electrodes are formed on the electrode pads.
Figure 14:
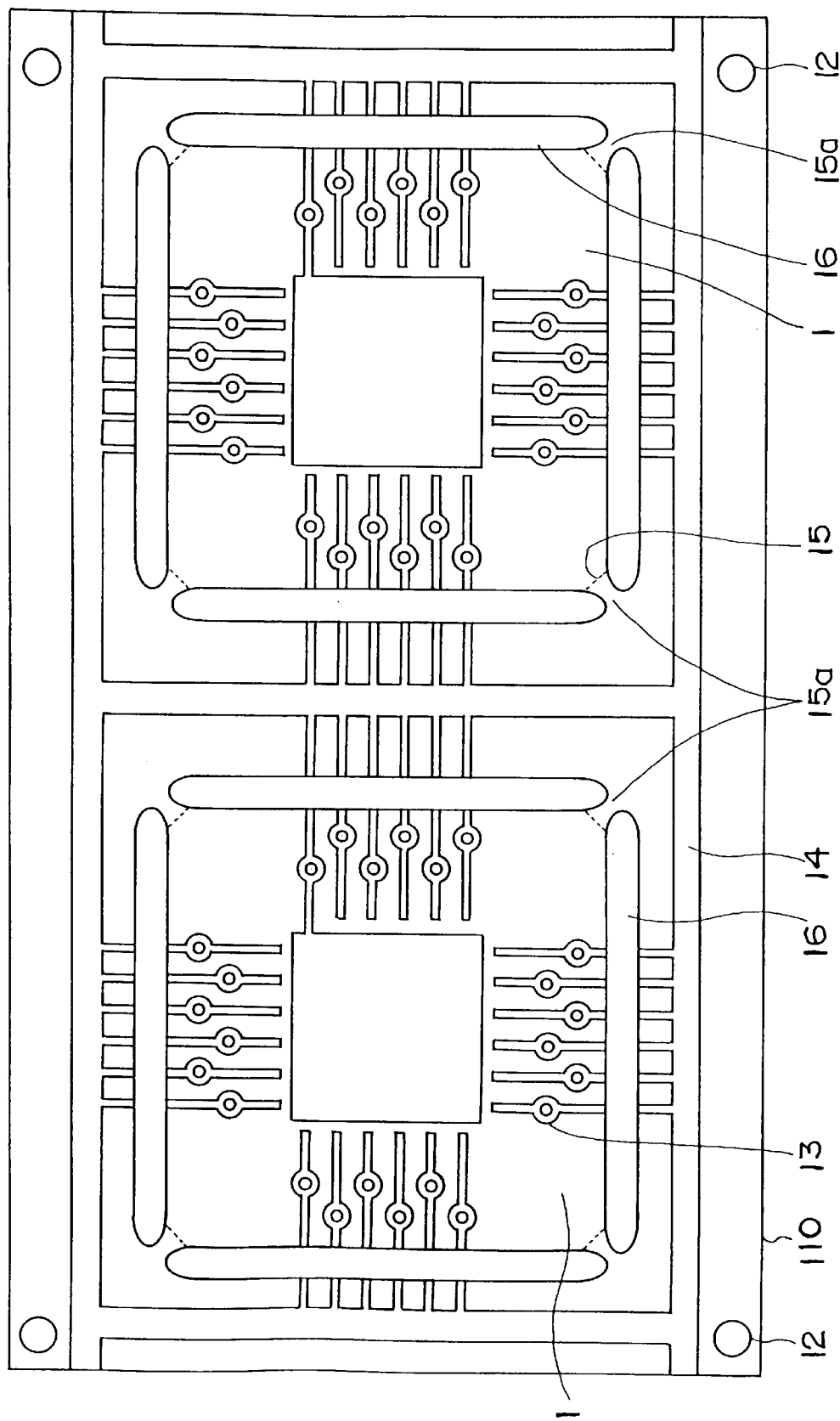
FIG. 14 is a top plan view for explaining another conventional main board.
Figure 15A:
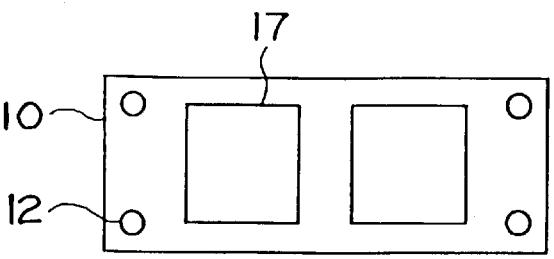
FIGS. 15(A)–15(G) are process diagrams in section for explaining another conventional method for manufacturing a flip chip semiconductor package.
Figure 15B:
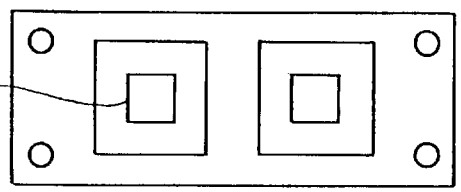
Figure 15C:
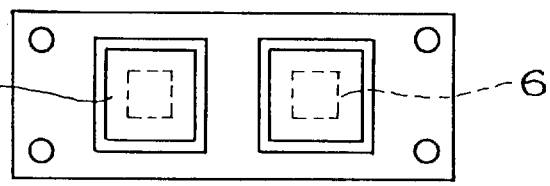
Figure 15D:
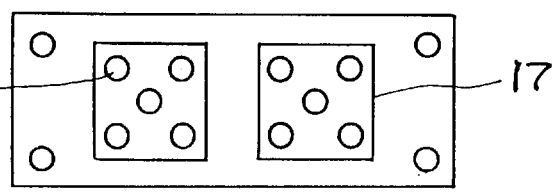
Figure 15E:
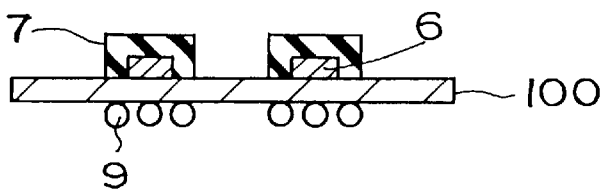
Figure 15F:
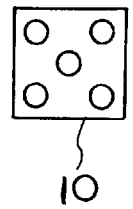
Figure 15G:
Figure 16A:
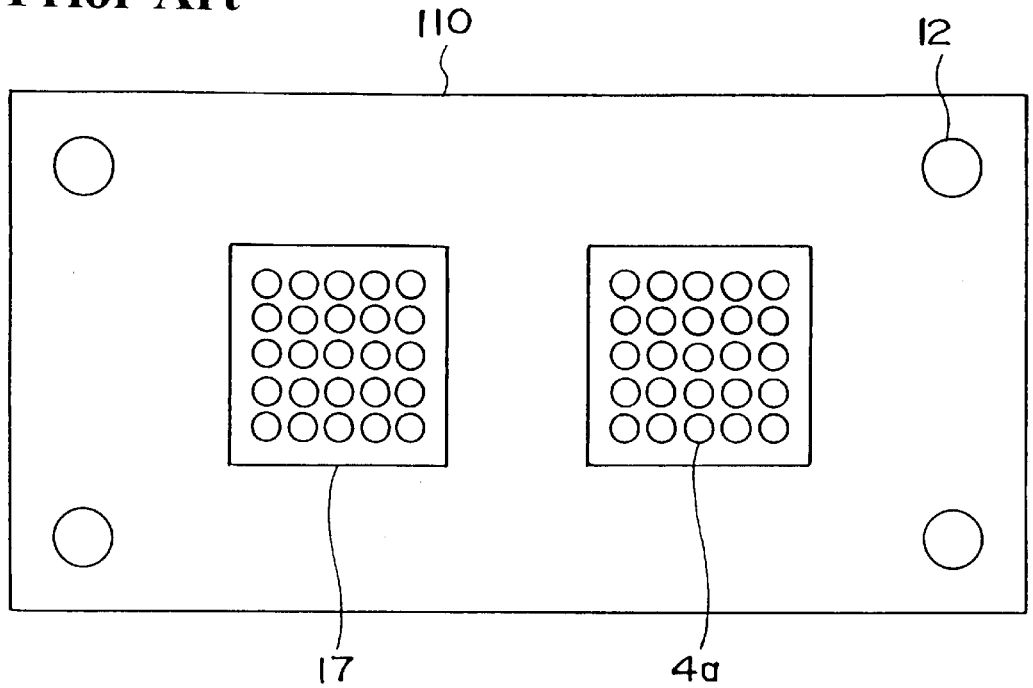
FIGS. 16(A)–16(C) relate to a conventional example, with FIG. 16(A) being a bottom plan view of a conventional main board, and FIGS. 16(B) and 16(C) being sectional process diagrams showing a method,for the formation of solder ball electrodes.
Figure 16B:
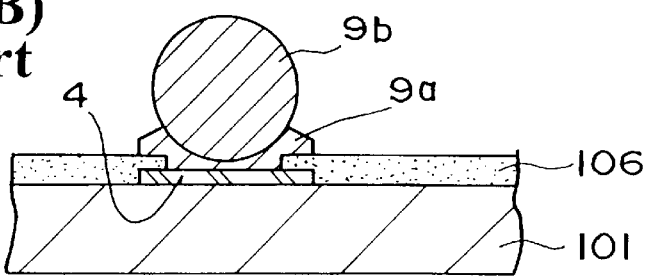
Figure 16C:
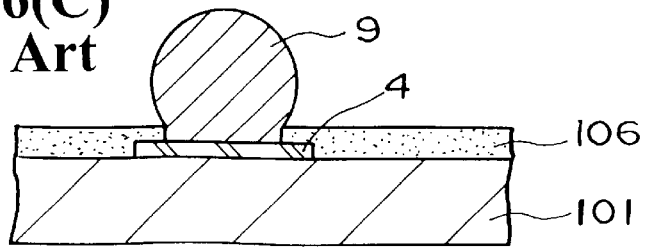
Figure 17:
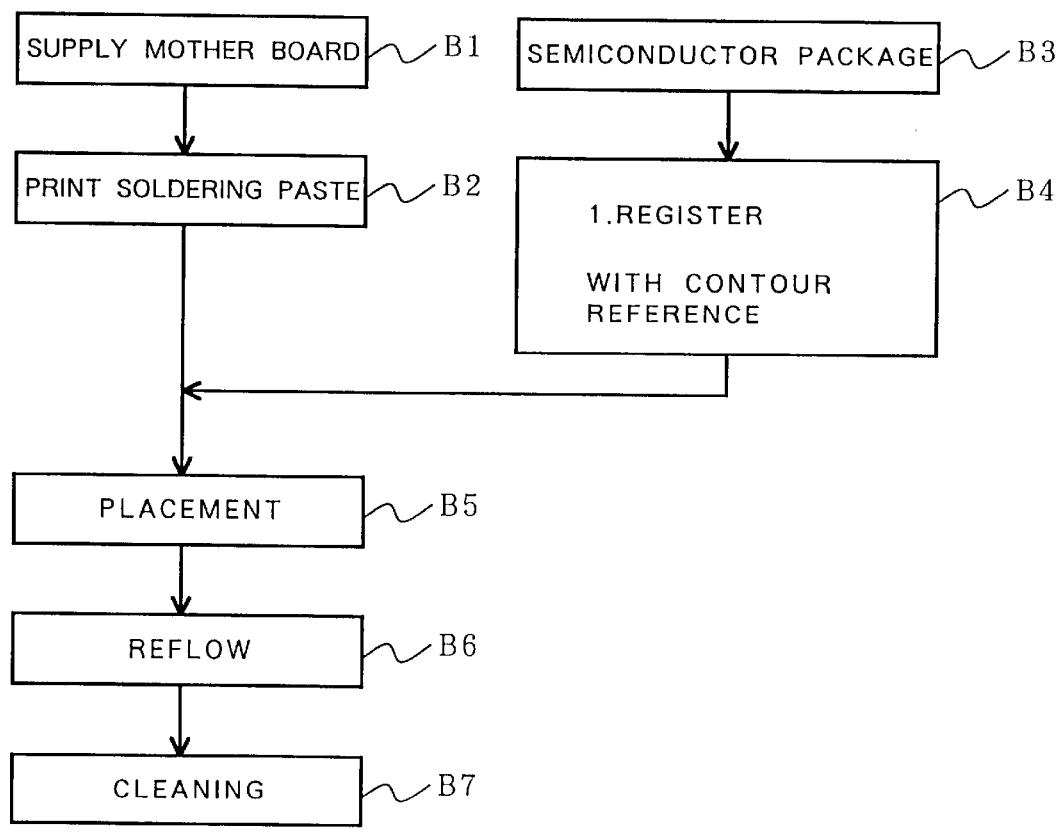
FIG. 17 relates to a conventional example and is a flowchart for explaining a conventional process for mounting the semiconductor packages onto the mother board.
Figure 18:
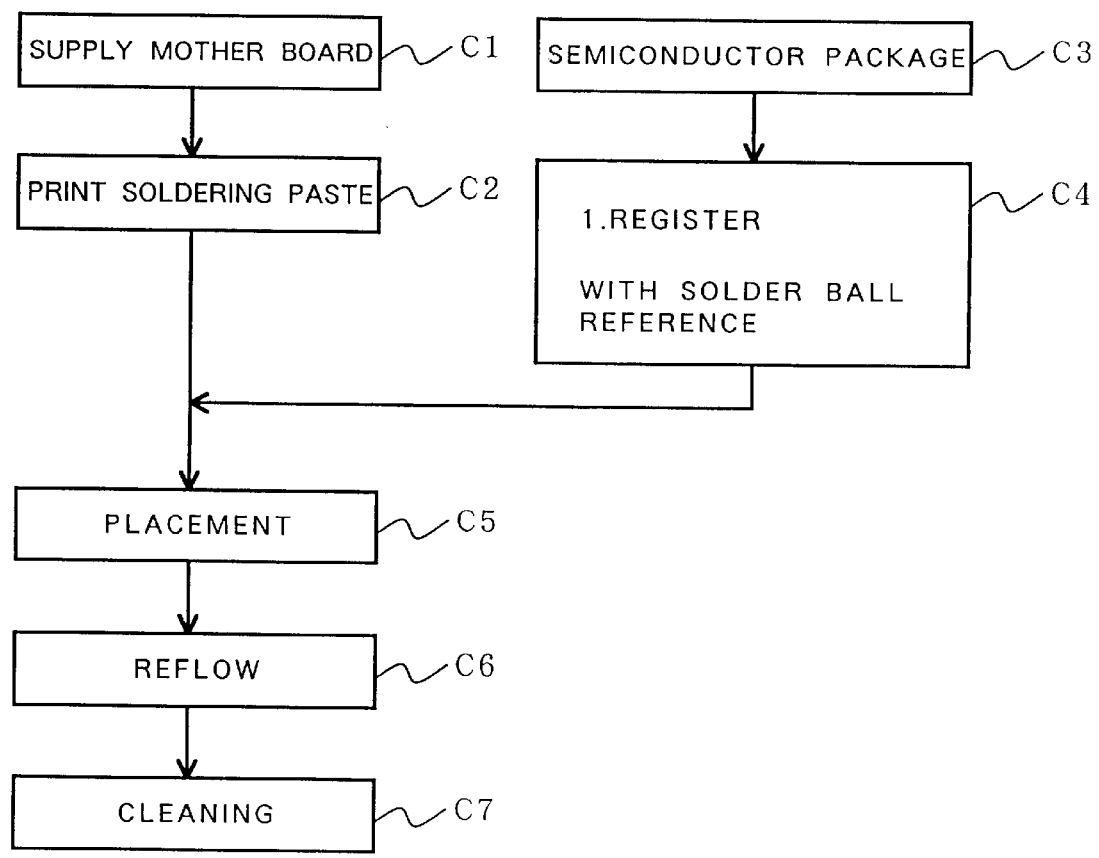
FIG. 18 relates to a conventional example and is a flowchart for explaining another conventional process for mounting the semiconductor packages onto the mother board.

First, FIG. 6(A) is a bottom plan view of a circuit board 1 of the main board 110 shown in FIG. 14. On its first main surface side, the circuit board 1 has patterns 20a and 20b formed at two points on the bottom surface between the electrode pads 4a. Also, the patterns 20a and 20b are of different contours. That is, the pattern 20a on one hand is a rectangular pattern, whereas the pattern 20b on the other is a circular pattern.

Figure 6B:
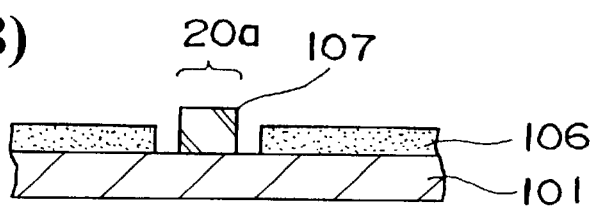

FIG. 6(B) is a sectional view of the register or patterns 20a taken along line 6(B)—6(B) of FIG. 6(A). As shown in FIG. 6(B), the contour of the pattern 20a is defined by the contour of the copper pattern. The copper pattern is made of the same material as that of the electrodes 4 for external connections.

Figure 6C:
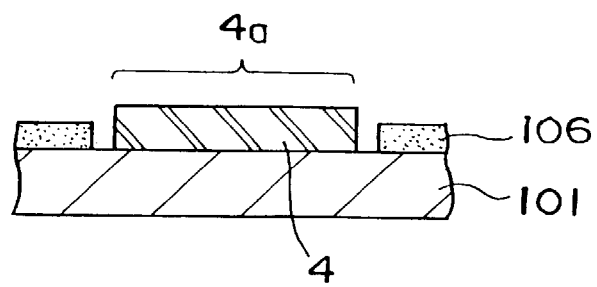

FIG. 6(C) is a sectional view of electrode pads 4a taken along line 6(C)—6(C) of FIG. 6(A). As shown in FIG. 6(C), the contour of the electrode pad 4a is defined by the contour of the electrode 4 for external connection. That is, in this case, the diameter of the opening in the solder resist 106 is larger than that of the electrode 4 for external connection.

Also, the contours of the electrode pads 4a and the contours of the patterns 20a and 20b are formed by photolithography using the same mask pattern.

Figure 6D:
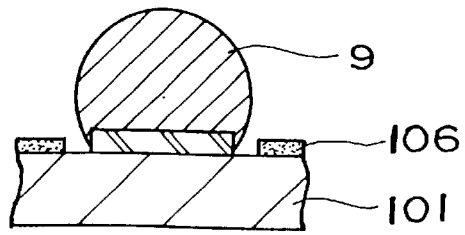

By forming the patterns 20a and 20b from the same material as that of the electrode pads 4a in this manner, it is possible to enhance the positional accuracy of the patterns 20a. 20b relative to the positions of the electrode pads 4a. As a result of this, by using these patterns, it is possible to determine the position of formation of the solder ball electrodes 9 on the electrode pads 4a with a higher accuracy as shown in FIG. 6(D).

That is, for the formation of the solder ball electrodes 9, a working hole 12 (see FIG. 14) is first used to perform provisional registration of the position of the circuit board. Afterward, the patterns 20a and 20b are recognized, and flux and a solder ball are placed on the electrode pads 4a to integrate the flux with the solder ball by reflow to thereby form the solder ball electrodes 9 on the electrode pads 4a.

By forming the solder ball electrodes 9 with the patterns 20a and 20b as reference in this manner, the solder ball electrodes 9 can be formed with a higher positional accuracy relative to the electrode pads 4a irrespective of the pitches of the electrode pads 4a.

Fourth Embodiment

Next, in a fourth embodiment, description is made for a main board provided with register or patterns for mounting, an electronic component device using the main board, and another example of a method for manufacturing the same.

Figure 7A:
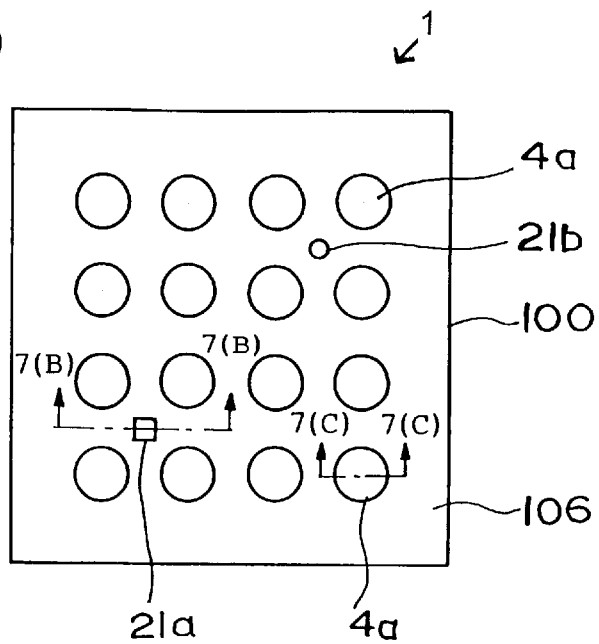
FIGS. 7(A)–7(D) relate to a fourth embodiment of the present invention, with FIG. 7(A) being a top plan view of a circuit board, FIG. 7(B) being a sectional view of register or patterns taken along line 7(B)—7(B) of FIG. 7(A), FIG. 7(C) being a sectional view of electrode pads taken along line 7(C)—7(C) of FIG. 7(A), and FIG. 7(D) being a sectional view of the state where the solder ball electrodes are formed on the electrode pads.

First, FIG. 7(A) is a bottom plan view of a circuit board 1 of the main board 110 shown in FIG. 14. On its first main surface side, the circuit board 1 has patterns 21a and 21b formed at two points on the bottom surface between the electrode pads 4a. Also, the patterns 21a and 21b are of different contours. That is, the pattern 21a on one hand is a rectangular pattern, whereas the pattern 21b on the other is a circular pattern.

Figure 7B:
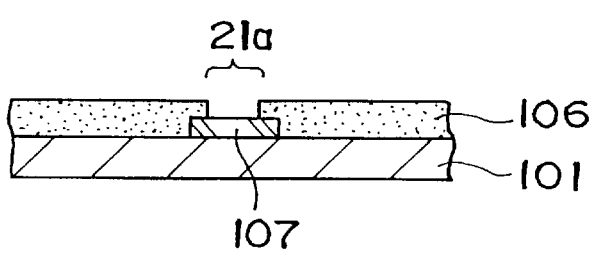

FIG. 7(B) is a sectional view of the pattern 21a taken along line 7(B)—7(B) of FIG. 7(A). As shown in FIG. 7(B), the contour of the pattern 21a is defined by the contour of the opening of the solder resist 106.

Figure 7C:
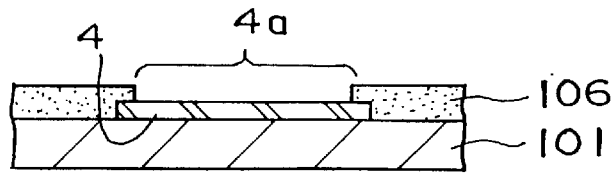

FIG. 7(C) is a sectional view of an electrode pad 4a taken along line 7(C)—7(C) of FIG. 7(A). As shown in FIG. 7(C), the contour of the electrode pad 4a is defined by the contour of the opening of the solder resist 106 covering the peripheral portion of the electrode 4 for external connection. That is, in this case, the diameter of the opening in the solder resist 106 is smaller than that of the electrode 4 for external connection.

Also, the contours of the electrode pads 4a and the contours of the patterns 21a and 21b are formed by photolithography using the same mask pattern.

Figure 7D:
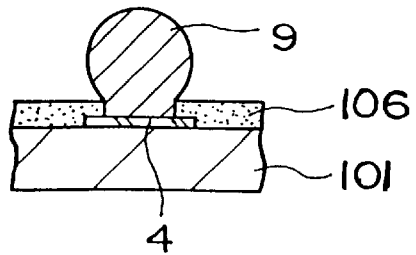

By forming the patterns 21a and 21b from the same material as that of the electrode pads 4a in this manner, it is possible to enhance the positional accuracy of the patterns 21a and 21b relative to the positions of the electrode pads 4a. As a result of this, by using these register or patterns, it is possible to determine the position in forming the solder ball electrodes 9 on the electrode pads 4a with a higher accuracy as shown in FIG. 7(D) in the same manner as the above third embodiment.

Figure 8:
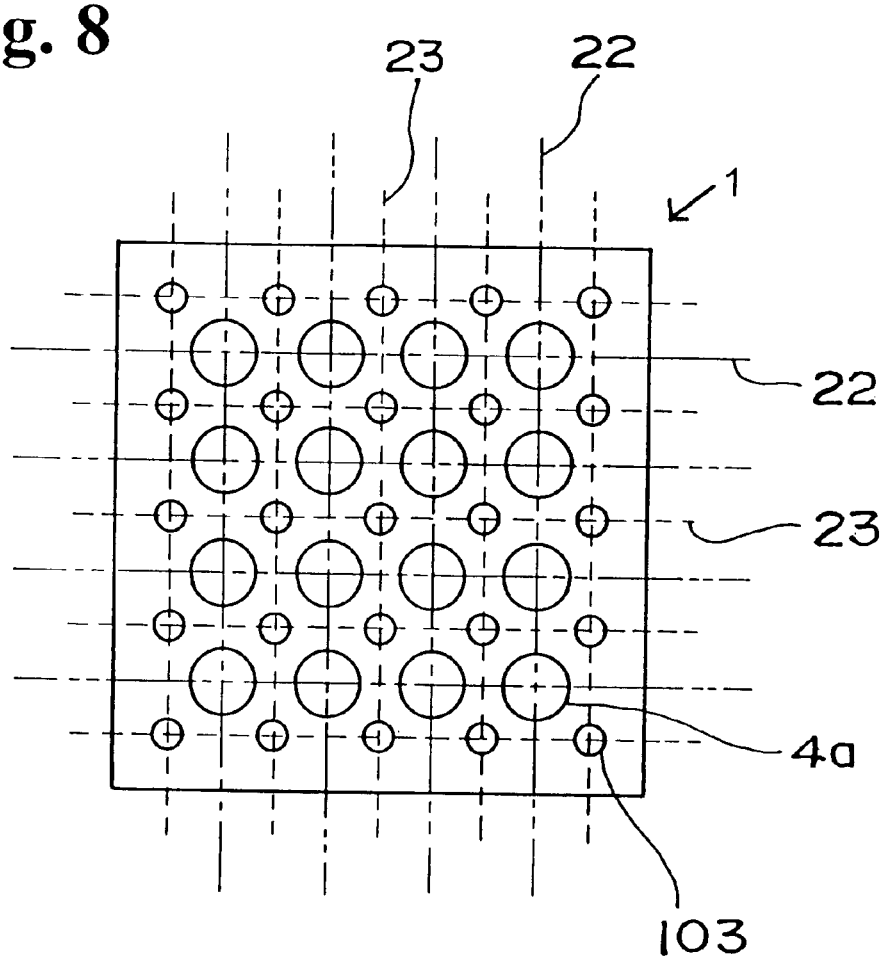
FIG. 8 relates to a fifth embodiment of the present invention and is a top plan view of a circuit board.

It is desired to form the register or patterns on the through-holes 103 between the electrode pads 4a for example. In the ordinary BGA the electrode pads 4a are arranged at intersections of grids 22 having a certain interval as shown in FIG. 8. These through-holes 103 are formed at positions which are offset by half size relative to the positions of these grids 22. In FIG. 8 broken lines 23 indicate the grids for the through-holes which have been offset by half size relative to the grids 22. It is then preferable to arrange the register or patterns 20a and 20b at any of the intersections of the grids indicated by the broken lines 23. By forming the register or patterns on the through-holes in this manner, it is possible to easily secure the regions for the formation of the register or patterns at a plurality of points without putting limitations on the positions to form the electrode pads.

Fifth Embodiment

Next, in a fifth embodiment, description is made for an electronic component device using the main board provided with the register or patterns for mounting and an example of a method for manufacturing the same.

In the fifth embodiment, the register or patterns (20a and 20b or 21a and 21b) set forth in the above third and fourth embodiments are utilized as recognition patterns for determining the positions in mounting electronic component devices onto the mother board.

Figure 9:
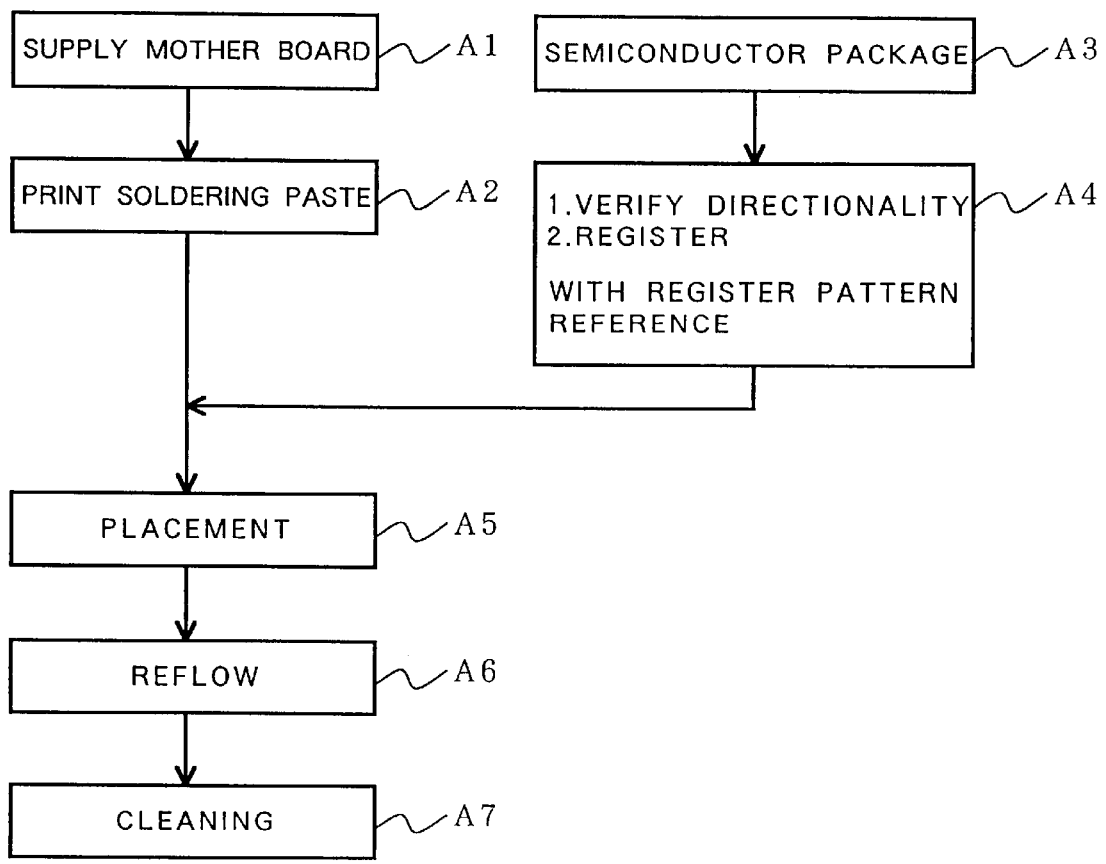
FIG. 9 relates to a sixth embodiment of the present invention and is a flowchart for explaining a process for mounting semiconductor packages onto a mother board.

Herein, a block diagram of FIG. 9 illustrates a process for mounting the BGA in the form of a semiconductor package onto the mother board. For the mounting onto the mother board, a mother board is first supplied (step A1).

Solder paste is then printed on the mother board at its electrode portions (step A2).

On the other hand, a semiconductor package (BGA) is manufactured in advance by using the main board on which are formed the register or patterns of the above third and fourth embodiments (step A3).

Then, upon mounting of the BGA onto the mother board, the arrangement of the patterns (e.g., 20a and 20b) on the bottom surface of the BGA at two points is recognized so that registration can be effected between the solder ball electrodes and the mother board electrode portions and that the directionality of the BGA relative to the mother board can be verified. In particular, the directionality of the BGA can easily be verified since the contours of the patterns are different from each other (step A4).

Subsequently the BGA is placed on the mother board (step A5).

Moreover, reflow is carried out to connect the solder ball electrodes of the BGA and the electrode portions of the mother board (step A6).

The mother board and the BGA are finally cleaned to complete the process of mounting onto the mother board (step A7).

By using the register or patterns as patterns for determining the positions in mounting onto the mother board in this manner, it is possible to determine the positions in mounting through recognition of only the arrangement pattern of the register or patterns. As a result of this, the time required for the pattern recognition can be reduced due to its narrow pattern recognition range, as compared with the case of recognition of the arrangement pattern of the protrusive electrodes placed over the entire bottom surfaces of the electronic component devices.

Furthermore, provision of two patterns having different contours enables the direction of the electronic component devices relative to the mother board to easily be verified even though the patterns have been formed with a symmetrical relationship. As a result of this, it is possible to obviate the mounting of the electronic component devices onto the mother board with wrong mounting directions.

Incidentally, the symmetrical positional relationship can include for example a centrosymmetrical positional relationship with respect to a central point (intersection of diagonal lines) of a rectangular circuit board and a line-symmetrical positional relationship with respect to a line passing through the central point.

Although the above embodiments have been described on the basis of examples in which formation is made by using specific materials under specific conditions, the present invention can variously be modified and altered. For example, in the above embodiments, description has been made for the examples in which the electronic components are IC chips, with the electronic component devices being in the form of flip chip semiconductor packages. In this invention, however, the electronic components and the electronic component devices are not limited to those examples.

Although in the above embodiments, description has been made for the examples in which the electrodes for external connections are provided on the reverse side of the surface on which the electronic components are mounted, the electronic components and the electrode pads for external connections may be provided on the same surface in this invention.

INDUSTRIAL APPLICABILITY

As set forth hereinabove, the flip chip semiconductor package and a method of manufacturing the same in accordance with the present invention are suitable as a flip chip semiconductor package having higher reliability and productivity, loaded into the camera integrated VTR or the small-sized hand-held equipment, and as the method of manufacture of the same, and as the main board for use in the manufacture of the package.

What is claimed is:

1. An electronic component device comprising:

a circuit board separated from a main board, electrode pads for external connection formed on one side of the circuit board, first means for defining shapes of the electrode pads to be exposed on the circuit board, said first means being partly formed on one side of the electrode pads, and second means for defining shapes of positioning signs formed at predetermined positions on the one side of the circuit board, said first and second means for defining the shapes of the electrode pads and the positioning signs being formed on a same member simultaneously.

2. The electronic component device according to claim 1, wherein said first means for defining the shapes of the electrode pads are formed of outer shapes of the electrode pads exposed on the circuit board, and said second means for defining the shapes of the positioning signs are formed of parts of the electrode pads.

3. The electronic component device according to claim 1, further comprising a solder resist formed on the electrodes, said solder resist being partially removed to form openings for exposing the electrode pads to thereby form the shapes of the electrode pads and parts of the solder resist at the predetermined positions on the main board being removed to form the shapes of the positioning signs.

4. The electronic component device according to claim 1, wherein said positioning sign indicates a position in forming protrusive electrodes on the electrode pads.

5. The electronic component device according to claim 1, wherein said positioning sign is a recognition sign for determining a position of the electronic component device in installing on a mother board.

6. The electronic component device according to claim 5, wherein said electronic component device has two signs as the positioning signs.

7. The electronic component device according to claim 6, wherein the two signs as the positioning signs have shapes different from each other.

8. The electronic component device according to claim 1, wherein in case said electrode pads are arranged at intersections of grids having predetermined intervals, and said second means for defining the shapes of the positioning signs are signs disposed at positions offset by half size relative to positions of the grids.

9. A main board comprising:

a plurality of circuit boards to be separated from the main board, electrode pads for external connections formed on one side of the circuit boards, first means for defining shapes of the electrode pads to be exposed on the one side of the main board, said first means being partly formed on the one side of the electrode pads, and second means for defining shapes of positioning signs formed at predetermined positions on the one side of the main board, said first and second means for defining the shapes of the electrode pads and the positioning signs being formed on a same member simultaneously so that a location of the main board or circuit boards is determined by said second means for the positioning signs.

10. The main board according to claim 9, wherein said second means for defining the shape of the positioning sign is formed outside the circuit boards to indicate a position of cutting of the circuit boards in the main board.

11. The main board according to claim 9, wherein said second means for defining the shape of the positioning sign is a sign for determining a position in forming protrusive electrodes on the electrode pads.

12. The main board according to claim 9, wherein said second means for defining the shapes of the positioning signs are recognition signs for determining positions of the circuit boards prepared from the main board in installing on a mother board.

* * * * *